(12) United States Patent
Yamazaki et al.

(10) Patent No.: US 6,538,272 B2
(45) Date of Patent: *Mar. 25, 2003

(54) SEMICONDUCTOR STORAGE DEVICE AND METHOD OF PRODUCING SAME

(75) Inventors: Shinobu Yamazaki, Tenri (JP); Kazuya Ishihara, Kyoto-fu (JP); Tetsu Miyoshi, Yokohama (JP); Jun Kudo, Nara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/534,352

(22) Filed: Mar. 24, 2000

(65) Prior Publication Data

US 2002/0185683 A1 Dec. 12, 2002

(30) Foreign Application Priority Data

Mar. 26, 1999 (JP) ............................................ 11-082776
Jul. 27, 1999 (JP) ............................................ 11-211740

(51) Int. Cl.[7] ........................ H01L 29/76; H01L 27/108
(52) U.S. Cl. ....................... 257/295; 257/295; 257/303; 257/306
(58) Field of Search ................................ 257/295, 306, 257/303

(56) References Cited

U.S. PATENT DOCUMENTS 5,335,138 A * 8/1994 Sandhu et al. .............. 361/303
5,459,345 A * 10/1995 Okudaira et al. ........... 257/310
5,612,574 A * 3/1997 Summerfelt et al. ........ 257/783
6,043,526 A * 3/2000 Ochiai ........................ 257/295
6,046,469 A * 4/2000 Yamazaki et al. .......... 257/306
6,188,098 B1 * 2/2001 Amanuma ................... 257/306
6,239,460 B1 * 5/2001 Kuroiwa et al. ............ 257/300
6,281,537 B1 * 8/2001 Kim ............................ 257/295
2001/0013614 A1 * 8/2001 Joshi et al. .................. 257/295

FOREIGN PATENT DOCUMENTS

| EP | 0495991 A1 | * | 7/1992 |
| JP | 11243182 A | | 7/1999 |
| KR | 98-36487 | | 2/1998 |
| WO | WO 98/05074 | | 2/1998 |

* cited by examiner

Primary Examiner—George C. Eckert, II
Assistant Examiner—Joseph Nguyen
(74) Attorney, Agent, or Firm—Nixon & Vanderhye PC (57) ABSTRACT

A contact plug electrically connected with a MOS transistor is formed in a first interlayer dielectric. Then, a barrier metal material is deposited over the first interlayer dielectric and the contact plug, and patterned into a barrier metal electrically connected with the contact plug. After a SiN film is formed as an anti-oxygen-permeation film over the barrier metal and the first interlayer dielectric, the film is abraded by a chemical mechanical polishing technique until a top surface of the barrier metal is exposed. Then, a lower electrode material, a dielectric material and an upper electrode material are deposited in this order on the SiN film and the barrier metal, and then patterned such that a resulting lower electrode covers at least the entire upper surface of the barrier metal. Thereafter a second interlayer dielectric is deposited, and a heat treatment is performed in an oxygen ambient to recover film quality of a capacitor dielectric.

12 Claims, 8 Drawing Sheets

SEMICONDUCTOR STORAGE DEVICE AND METHOD OF PRODUCING SAME

BACKGROUND OF THE INVENTION

The present invention relates to a semiconductor storage device and a method of producing same, and more particularly, to a semiconductor storage device having a ferroelectric capacitor as a charge storage capacitor and a method of producing such a device.

Recently, research and development of nonvolatile semiconductor storage devices using a ferroelectric has been energetically made, and some of them have been brought into practice. The conventionally used planar memory cell structure, however, does not serve to increase the integrated density and storage capacity because the cell size of the planar structure is as large as about 100 $\mu m_2$. In contrast, the stacked structure is suitable for increasing the storage capacity. The stacked structure is a structure in which a ferroelectric capacitor is formed above a source or a drain of a selection transistor via a conductive plug made of, e.g., polysilicon doped with impurities.

In the stacked structure, a capacitor lower electrode is formed on or above the plug of, for example, polysilicon. As an electrode material, a precious metal such as platinum (Pt) is normally used in ferroelectric capacitors. If such a metal is deposited directly on silicon, however, a silicide formation reaction takes place between those materials at relatively low temperatures, which results in poor conduction at the interface between the lower electrode and the conductive plug, and hillocks on a film surface. Conventionally, in order to suppress these phenomena, a barrier metal formed of, for example, titanium nitride (TiN), nitride of an alloy of tantalum and silicon (TaSiN), etc. is provided between the polysilicon plug and the lower electrode.

Those nitrides can suppress the silicide formation reaction between the polysilicon plug and the lower electrode. However, when the lower electrode is formed of Pt, which is very permeable to oxygen, a surface of the barrier metal gets oxidized during a heat treatment performed in an oxygen ambient for crystallization of the ferroelectric. The oxidation of the barrier metal also invites hillocks and film detachment between the lower electrode and the barrier metal. To prevent such a disadvantage, iridium (Ir) having a low permeability to oxygen is often used as a lower electrode material to thereby realize a ferroelectric capacitor having a high resistance to oxidation.

In an ordinary device fabrication process, a barrier metal material, a lower electrode material, a ferroelectric material and an upper electrode material are stacked in this order and then, these materials are subjected to an etching process in the reverse order to thereby form a ferroelectric capacitor including the upper electrode, ferroelectric film and lower electrode, and a barrier metal. After that, a heat treatment process is performed to recover the ferroelectric film. During the etching process and the heat treatment process, however, the following problems take place.

When etching Pt and Ir by a dry etching technique, there occurs etch residue on side surfaces of a resulting pattern and a resist. Etching the barrier metal material without removing such etch residue on the pattern and/or the resist results in change of the pattern size, or shift of the pattern outline. This makes it difficult to form the barrier metal material into a desired shape and also causes a short circuit between the upper and lower electrodes.

If etch residue newly occurs during the etching of the barrier metal material as well, so that the new etch residue is cumulated on the previous etch residue, it is very difficult to remove the cumulative etch residue. In order to prevent cumulation of the etch residue from occurring, it is necessary to stop etching at an interface between the lower electrode material and the barrier metal material, remove the etch residue on the lower electrode, and then start etching the barrier metal material. In most cases, however, it is very difficult to stop the etching at the interface between the lower electrode and the barrier metal material because the etching selection ratio of the lower electrode to the barrier metal is small.

There is another problem. When a ferroelectric material is incorporated in an integrated circuit, the ferroelectric material is subjected to various fabrication processes. Specifically, in the process of forming a ferroelectric capacitor, the ferroelectric material is directly subjected to a dry etching process and a treatment using a chemical liquid. This does damage to the capacitor. Recovery from the damage requires a heat treatment preferably at a temperature as high as 700° C. and in an oxygen ambient.

After the capacitor is formed, more specifically, immediately after the lower electrode and the barrier metal are completed through the processing of the lower electrode material and the barrier metal material, side surfaces of the barrier metal are exposed or not covered with any film. If the heat treatment is performed in the oxygen ambient in such a state, the oxidation reaction will proceed in the barrier metal starting from its side surfaces, resulting in the poor conduction due to an increased resistance, development of hillocks, and film detachment. To avoid such disadvantages, conventionally, the heat treatment after the formation of the lower electrode and barrier metal has been performed in an ambient containing no oxygen, such as a nitrogen ambient.

In addition, if a further heat treatment is performed in the oxygen ambient in a process after an interlayer dielectric has been formed over the ferroelectric capacitor, oxygen tends to diffuse through the interlayer dielectric formed of, for example, NSG (Non-doped Silicate Glass) into the barrier metal, so that the barrier metal is oxidized. For this reason, it is difficult to perform a high-temperature heat treatment in the oxygen ambient after the lower electrode and the barrier metal have been formed, which means that it is difficult to recover the characteristic of the ferroelectric capacitor.

SUMMARY OF THE INVENTION

Accordingly, an object of the present invention is to provide a semiconductor storage device having a structure that allows the barrier metal to be prevented from oxidation during a high-temperature heat treatment even in an oxygen ambient in the process of producing the device, and to provide a method of producing such a semiconductor storage device.

Another object of the present invention is to provide a semiconductor storage device with a structure which can solve the above etch residue-related problems, and also to provide a method of producing such a semiconductor storage device.

According to an aspect of the present invention, in a semiconductor storage device comprising a MOS transistor formed on a semiconductor substrate, and a capacitor having a lower electrode, an upper electrode, and a dielectric between the lower and upper electrodes, the lower electrode of the capacitor being electrically connected with a source/drain region of the MOS transistor through a contact plug and a barrier metal provided on or above the contact plug, an improvement is characterized in that:

an anti-oxygen-permeation film is formed on entire side surfaces of the barrier metal; and the lower electrode covers at least an entire upper surface of the barrier metal.

The dielectric may be a ferroelectric.

With the above arrangement, due to the presence of the anti-oxygen-permeation film on the entire side surfaces of the barrier metal, the barrier metal is prevented from being oxidized during a heat treatment which is performed in an oxygen ambient for recovery of the dielectric, especially, of a ferroelectric in the process of producing the storage device. Therefore, the semiconductor storage device is allowed to have a good dielectric (especially ferroelectric) film characteristic.

This storage device can be produced, for example, by a method according to another aspect of the present invention, which comprises the steps of:

depositing a first interlayer dielectric over a semiconductor substrate formed with a MOS transistor, and then forming in the first interlayer dielectric a contact hole leading to a source/drain region of the MOS transistor, and filling the contact hole with a conductive material to thereby form a contact plug electrically connected with the source/drain region;

depositing a barrier metal material over the first interlayer dielectric and the contact plug, and patterning the barrier metal material into a barrier metal which is positioned on or above the contact plug so as to be electrically connected with the contact plug;

depositing an anti-oxygen-permeation film over the barrier metal and the first interlayer dielectric such that a top surface of the anti-oxygen-permeation film on the first interlayer dielectric is at a level higher than a top surface of the barrier metal, and then abrading the anti-oxygen-permeation film by a chemical mechanical polishing technique until the top surface of the barrier metal is exposed;

depositing a lower electrode material, a dielectric material and an upper electrode material in this order on the anti-oxygen-permeation film and the barrier metal, and patterning the upper electrode material, the dielectric material, and the lower electrode material in this order into an upper electrode, a dielectric, and a lower electrode such that the lower electrode covers at least the entire upper surface of the barrier metal, whereby a capacitor associated with the MOS transistor is formed;

depositing a second interlayer dielectric in such a manner that the capacitor is entirely covered with the second interlayer dielectric, and then, forming in the second interlayer dielectric a contact hole leading to the upper electrode; and performing a heat treatment in an oxygen ambient to recover film quality of the dielectric of the capacitor.

In one embodiment, the anti-oxygen-permeation film is generally L-shaped in section and an insulating film is formed on side surfaces of the anti-oxygen-permeation film, and the insulating film has a film stress smaller than a film stress of the anti-oxygen-permeation film or has a film stress acting in a direction opposite to a direction in which the film stress of the anti-oxygen-permeation film acts.

The semiconductor storage device according to this embodiment can be fabricated by, for example, of a method according to still another aspect of the present invention, which comprises the steps of:

depositing a first interlayer dielectric over a semiconductor substrate formed with a MOS transistor, and then forming in the first interlayer dielectric a contact hole leading to a source/drain region of the MOS transistor, and filling the contact hole with a conductive material to thereby form a contact plug electrically connected with the source/drain region;

depositing a barrier metal material over the first interlayer dielectric and the contact plug, and patterning the barrier metal material into a barrier metal which is positioned on or above the contact plug so as to be electrically connected with the contact plug;

depositing an anti-oxygen-permeation film over the barrier metal and the first interlayer dielectric such that a top surface of the anti-oxygen-permeation film on the first interlayer dielectric is at a level lower than a top surface of the barrier metal, and then depositing an insulating film over the anti-oxygen-permeation film such that a top surface of the insulating film above the first interlayer dielectric is at a level higher than the top surface of the barrier metal, the insulating film being formed of a material having a film stress smaller than a film stress of the anti-oxygen-permeation film or a film stress acting in a direction opposite to a direction in which the film stress of the anti-oxygen-permeation film acts;

abrading the insulating film and the anti-oxygen-permeation film by a chemical mechanical polishing technique until the top surface of the barrier metal is exposed;

depositing a lower electrode material, a dielectric material and an upper electrode material in this order on the insulating film, the anti-oxygen-permeation film and the barrier metal, and patterning the upper electrode material, the dielectric material, and the lower electrode material in this order into an upper electrode, a dielectric, and a lower electrode such that the lower electrode covers at least the entire upper surface of the barrier metal, whereby a capacitor associated with the MOS transistor is formed;

depositing a second interlayer dielectric in such a manner that the capacitor is entirely covered with the second interlayer dielectric, and then, forming in the second interlayer dielectric a contact hole leading to the upper electrode; and performing a heat treatment in an oxygen ambient to recover film quality of the dielectric of the capacitor.

In one embodiment, the anti-oxygen-permeation film is formed of a material same as a material of the lower electrode so that the anti-oxygen-permeation film and the lower electrode are unified.

Due to the unified structure of the anti-oxygen-permeation film and the lower electrode, namely, a one-piece structure, the semiconductor storage device of this embodiment can be fabricated with less process steps, compared with a case that the anti-oxygen-permeation film and the lower electrode are formed of different materials.

The semiconductor storage device according to this embodiment can be produced by, for example, of a method according to a further aspect of the present invention, which comprises the steps of:

depositing a first interlayer dielectric over a semiconductor substrate formed with a MOS transistor, and then forming in the first interlayer dielectric a contact hole leading to a source/drain region of the MOS transistor, and filling the contact hole with a conductive material to thereby form a contact plug electrically connected with the source/drain region;

depositing a barrier metal material over the first interlayer dielectric and the contact plug, and patterning the barrier metal material into a barrier metal which is positioned on or above the contact plug so as to be electrically connected with the contact plug;

depositing a lower electrode material over the barrier metal and the first interlayer dielectric such that a top surface of the lower electrode material on the first interlayer dielectric is at a level higher than a top surface of the barrier metal, and then planarizing the lower electrode material;

depositing a dielectric material and an upper electrode material in this order on the planarized lower electrode material, and patterning the upper electrode material, the dielectric material, and the lower electrode material in this order into an upper electrode, a dielectric, and a lower electrode such that the lower electrode covers the entire upper surface and entire side surfaces of the barrier metal, whereby a capacitor associated with the MOS transistor is formed;

depositing a second interlayer dielectric in such a manner that the capacitor is entirely covered with the second interlayer dielectric, and then, forming in the second interlayer dielectric a contact hole leading to the upper electrode; and performing a heat treatment in an oxygen ambient to recover film quality of the dielectric of the capacitor.

With use of any of the above methods, when the lower electrode material is etched for patterning, the barrier metal has already been completed and its side surfaces are covered with the anti-oxygen-permeation film (or the lower electrode material). Therefore, it is possible to solve the problems caused by etch residue, such as change in the pattern size, a short circuit between the upper and lower electrodes.

With use of any of the above methods, because the lower electrode material and the barrier metal material are etched at different steps for patterning, it is easy to remove etch residue, unlike the conventional method in which the lower electrode material and the barrier metal material are continuously etched. Therefore, it is possible to suppress the etch residue-related problems such as change in the pattern size, a short circuit between the upper and lower electrodes, etc.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

FIGS. 1A–1H show process steps for producing a semiconductor storage device according to a first embodiment of the present invention. FIGS. 4A–4E show process steps for producing a semiconductor storage device according to a second embodiment. FIGS. 6A–6I show process steps for producing a semiconductor storage device according to a third embodiment.

In these figures, reference numeral 1 denotes a silicon substrate, reference numeral 2 denotes a first interlayer dielectric, reference numeral 3 denotes a gate insulator, reference numeral 4 denotes a gate electrode of a MOS transistor, and reference numeral 5 denotes a source/drain region of the MOS transistor. Also, reference numeral 6 denotes a polysilicon plug, reference numeral 7 denotes a Ti (titanium) film as an adhesion layer, reference numeral 8 denotes a tantalum silicon nitride film as a material of a barrier metal 8a, reference numeral 9 denotes a silicon nitride film formed by a plasma enhanced CVD (chemical vapor deposition) method). Reference numeral 10 denotes an Ir (iridium) film as a material of a lower electrode 10a of a capacitor, reference numeral 11 denotes a SBT film as a material of a ferroelectric film 11a of the capacitor, reference numeral 12 denotes a Pt (platinum) film as a material of an upper electrode 12a of the capacitor, reference numeral 13 denotes a titanium oxide film as a diffusion barrier film, and reference numeral 14 denotes a second interlayer dielectric. Also, reference numeral 15 denotes wiring, reference numeral 16 denotes a silicon nitride film formed by a low-pressure CVD method, and reference numeral 17 denotes an ozone TEOS (tetraethylorthosilicate)—NSG film.

First Embodiment

The following describes process steps of fabricating the semiconductor storage device according to the first embodiment with reference to FIGS. 1A–1H.

Figure 1A:
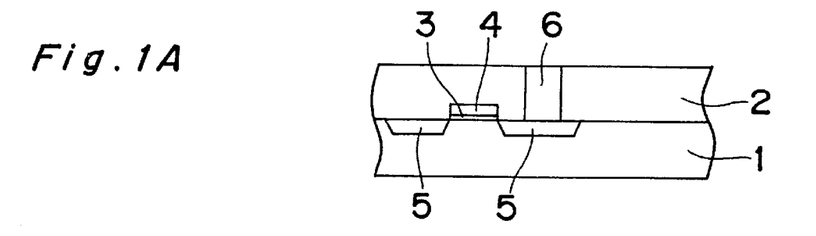
FIGS. 1A, 1B, 1C, 1D, 1E, 1F, 1G and 1H show process steps for producing a semiconductor storage device according to a first embodiment of the present invention.

First, using a CVD method, a silicon oxide film is formed as a first interlayer dielectric 2 on the silicon substrate 1 formed with the MOS transistor. Then, a contact hole of 0.6 $\mu$m in diameter is formed in the first interlayer dielectric 2 in a position on a source/drain region 5 of the MOS transistor. By the CVD method, polysilicon is deposited such that the contact hole is filled with polysilicon, which is then doped with phosphorus (P) for resistance reduction. Thereafter, the phosphorus-diffused polysilicon and the first interlayer dielectric 2 are planarized by CMP (Chemical Mechanical Polishing). As a result, a polysilicon plug 6 is formed (FIG. 1A).

Figure 1B:
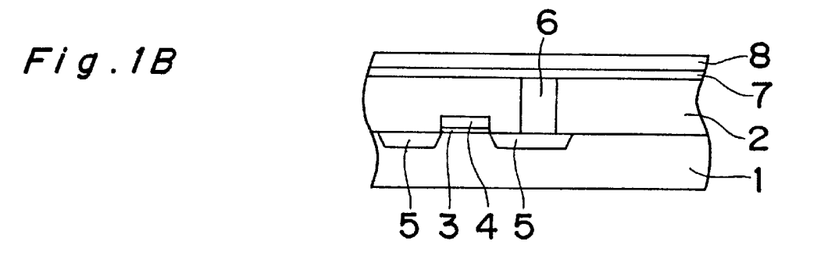
Figure 1C:
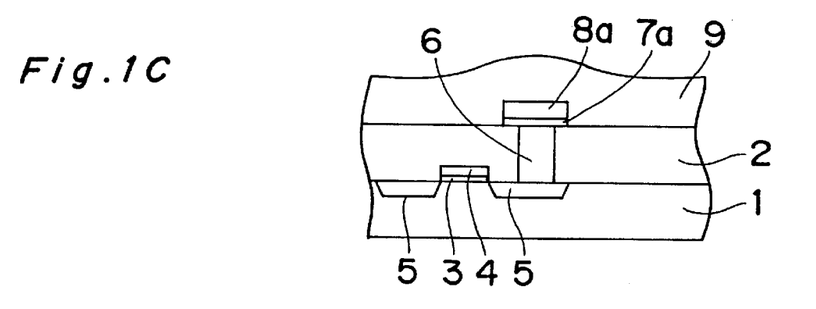

Next, a Ti film 7 is formed to a thickness of 20 nm by a DC magnetron sputtering method. Then, tantalum silicon nitride (TaSiN) film 8 is formed to a thickness of 100 nm by a reactive DC magnetron sputtering method using an alloy of tantalum and silicon as a target (FIG. 1B). The sputtering conditions are: a DC power of 2.0 kW, a substrate temperature of 500° C., and sputtering gases of Ar and $N_2$ at a flow rate of 24 sccm and 16 sccm, respectively. After the sputtering process, a heat treatment is performed at a temperature of 600° C. and in an N₂ ambient to densify the TaSiN film 8. Then, using a known photolithography and dry etching technique, the TaSiN film 8 and the Ti film 7 are patterned into a barrier metal 8a and an adhesion layer 7a, each 1.2 μm square, which entirely cover the upper surface of the polysilicon plug 6. For the dry etching process, an ECR (Electron Cyclotron Resonance) etcher is used. Next, a silicon nitride (P—SiN) film 9 is deposited to a thickness of 200 nm on the barrier metal 8a and the first interlayer dielectric 2 by the plasma enhanced CVD method (FIG. 1C). The P—SiN film 9 is formed at a substrate temperature of 400° C.

Figure 1D:
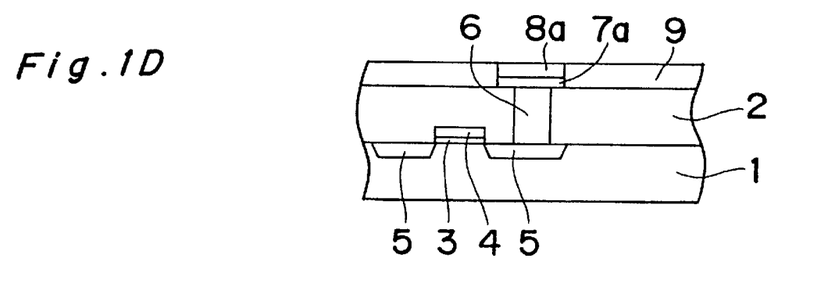

Next, the P—SiN film 9 is abraded by the CMP method such that a top surface of the TaSiN barrier metal 8a is exposed and that a planarized surface is obtained (FIG. 1D). Instead of the P—SiN film 9, a silicon oxide nitride (P—SiN) film may be deposited to a film thickness of 200 nm at a substrate temperature of 400° C. by the plasma enhanced CVD method.

Figure 1E:
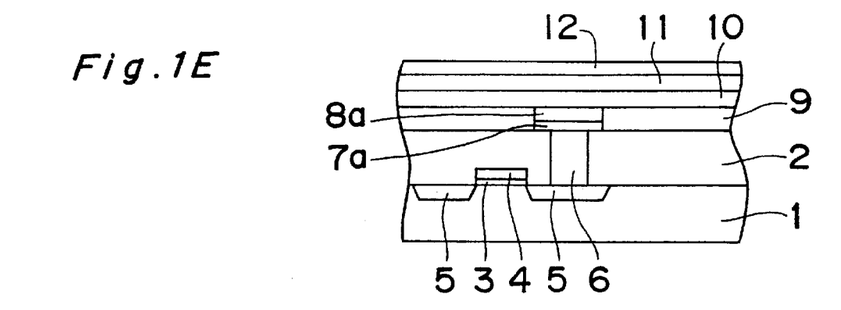
Figure 1F:
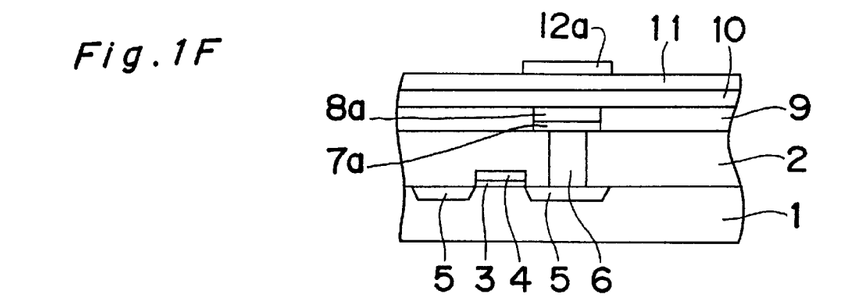
Figure 1G:
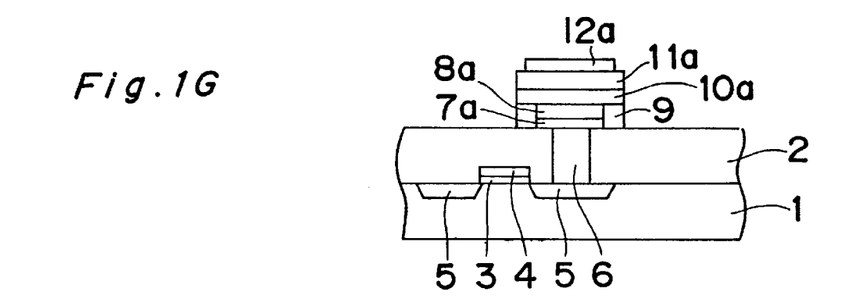

Next, an iridium (Ir) film 10, which will be formed into a lower electrode, is deposited to a thickness of 150 nm by the DC magnetron sputtering method. Then, a ferroelectric film 11 is formed. In this embodiment, an SrBi₂Ta₂O₉ (SBT) film 11 is formed as the ferroelectric film in the following manner. First, an organic metal solution containing metal elements of Sr, Bi and Ta is applied onto the Ir film 10 by spin coating, and then dried. Then, the resulting film is annealed for crystallization for 30 minutes at a temperature of 700° C. in an O₂ ambient and under a normal pressure. These steps are repeated until a desired film thickness is obtained. The composition ratio of the elements in the organic metal solution is Sr:Bi:Ta=0.8:2.4:2.0, and the final film thickness of the SBT film 11 is 150 nm. After the SBT film 11 has been completed, a platinum (Pt) film 12 is deposited to a film thickness of 100 nm by the DC magnetron sputtering (FIG. 1E). Then, the Pt film 12 is patterned into an upper electrode 12a by a known photolithography and dry etching technique (FIG. 1F), and subsequently the films 11 and 10 are patterned into a ferroelectric 11a and an Ir lower electrode 10a of a capacitor by a known photolithography and dry etching technique (FIG. 1G). Note that after etching the Pt film 12, a heat treatment is performed for 30 minutes as an electrode annealing process at a temperature of 700° C. in an O₂ ambient. The size of the Ir film or lower electrode 10a is large enough to cover the entire top surface of the TaSiN barrier metal 8a, namely it is larger than the size of the barrier metal 8a. In this embodiment, the Ir lower electrode 10a has a size of 4 μm by 4 μm. In processing the Ir film 10 into the Ir lower electrode 10a, the P—SIN film 9, or a liner, will also be etched so that the first interlayer dielectric 2 is exposed. The first interlayer dielectric 2, however, does not necessarily need to be exposed.

According to the conventional method as mentioned above, it is necessary to stop the etching at an interface between the Ir film 10, which will be a lower electrode, and the TaSiN film 8, which will be a barrier metal. In contrast, according to the embodiment, if the Ir film 10 is overetched, not the TaSiN film 8 but the P—SiN film 9 is etched. Accordingly, etch residue occurring in the etching process of the Ir film 10 is easily removable by a chemical liquid. The P—SiN film 9 thus patterned will serve as an anti-oxygen-permeation film for preventing the TaSiN barrier metal 8a from being oxidized during a ferroelectric-recovery heat treatment process that is performed later. To this end, the P—SiN film 9 around the barrier metal has preferably a wall thickness, or a thickness in the horizontal direction, of from 0.1 to 2.0 μm inclusive. If the wall thickness is below 0.1 μm, the P—SiN film 9 becomes permeable to oxygen. If the wall thickness is over 0.2 μm, the device size will conspicuously increase.

After the above etching process, a titanium oxide (TiO₂) film 13 as a diffusion barrier film is deposited to a thickness of 25 nm by sputtering and then the film is processed into a pattern to cover or envelope almost the entire ferroelectric capacitor. After that, a second interlayer dielectric 14 is deposited to a thickness of 300 nm. This second interlayer dielectric 14 is an ozone TEOS-NSG film like the first interlayer dielectric. Then, a contact hole leading to the upper electrode 12a of the ferroelectric capacitor is formed in the second interlayer dielectric 14 and TiO₂ film 13 by photolithography and dry etching.

Next, a heat treatment is performed to recover the ferroelectric. The heat treatment conditions are: a temperature of 700° C., a time of 30 minutes, and an O₂ ambient under a normal pressure. In the fabrication process for the conventional semiconductor storage device, after the ferroelectric capacitor has been formed, it is difficult to perform a high temperature heat treatment in the O₂ ambient for the following reason. That is, the barrier metal tends to be oxidized from its sides by oxygen permeating into the barrier metal through the second interlayer dielectric 14. The oxidation of the barrier metal invites the problems of poor conduction, hillocks, and film detachment. In contrast, with the arrangement of the present invention, the P—SiN film 9 suppresses the permeation of oxygen, so that it is much less possible for the barrier metal to be oxidized. Accordingly, in this first embodiment, occurrence of the poor conduction and/or the film detachment is well suppressed.

Figure 1H:
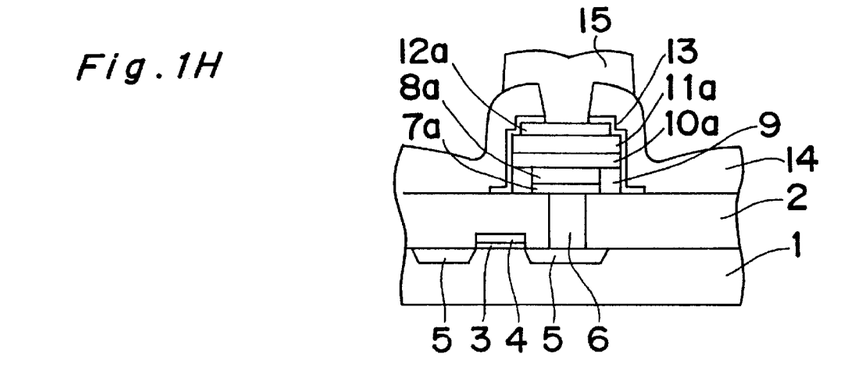

After the contact hole is made, wiring 15 of an Al-based material is formed (FIG. 1H).

Figure 2:
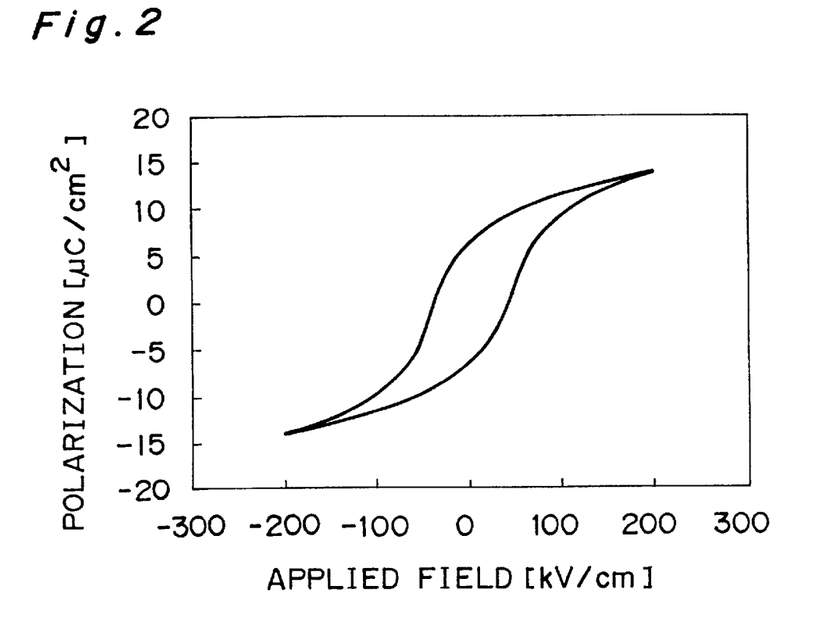
FIG. 2 shows a hysteresis characteristic of a ferroelectric capacitor in the semiconductor storage device of the first embodiment when a SiN film is used as an anti-oxygen-permeation film.
Figure 3:
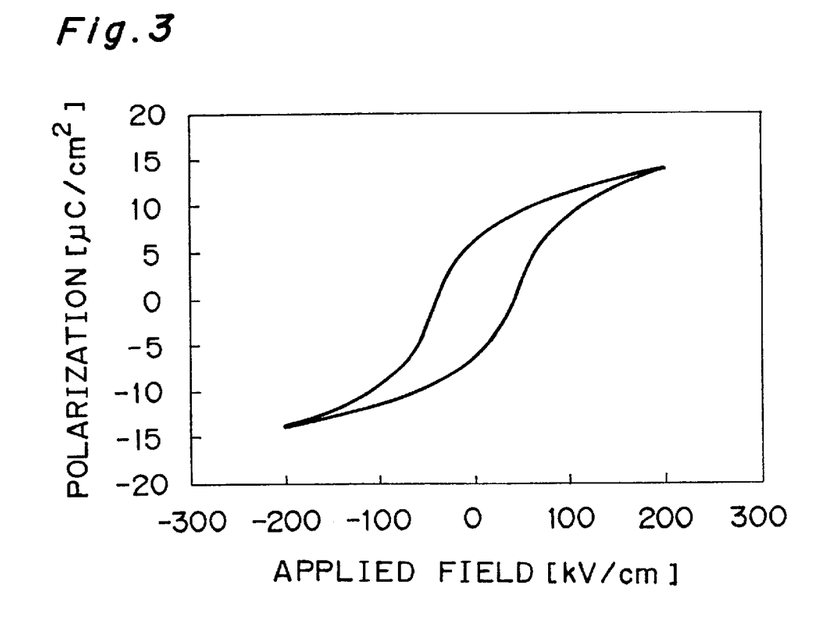
FIG. 3 shows a hysteresis characteristic of the ferroelectric capacitor in the semiconductor storage device of the first embodiment when a SiON film is used as an anti-oxygen-permeation film.

FIG. 2 shows the hysteresis characteristic of a ferroelectric capacitor, formed through the above steps, in which the P—SiN film is used as the anti-oxygen-permeation film. Also, FIG. 3 shows the hysteresis characteristic of a ferroelectric capacitor, formed through the above steps, in which a P—SiN film is used as the anti-oxygen-permeation film. In both cases, the hysteresis curves show good symmetry, which proves that considerably good results were obtained.

Second Embodiment

The fabrication process steps for a semiconductor storage device according to a second embodiment of the invention will be described below with reference to FIGS. 4A–4E.

First, through process steps similar to the process steps adopted in the first embodiment (see FIGS. 1A–1C), a TaSiN barrier metal 8a and a Ti adhesion layer 7a, each 1.2 μm square, are formed in such a manner that these films 7a and 8a cover an entire top surface of the polysilicon plug 6. Thereafter, a SiN film 16 is deposited to a thickness of 0.03 μm on the barrier metal 8a and the first interlayer dielectric 2 by a low pressure CVD method at a substrate temperature of 700° C. Then, an ozone TEOS-NSG film 17 is formed to a thickness of 200 nm (FIG. 4A) The film thickness of the SiN film 16 formed by the low pressure CVD method is preferably 0.03 μm or more. If the SiN film 16 has a film thickness of below 0.03 μm, the film 16 is permeable to oxygen. An insulating film to be formed on the SiN anti-oxygen-permeation film 16 is not limited to the ozone TEOS-NSG film 17, but may be of any type so far as the insulating film has a smaller film stress than the SiN anti-oxygen-permeation film 16 does, or has a film stress acting in a direction opposite to a direction in which a film stress of the SiN film 16 acts.

Figure 4A:
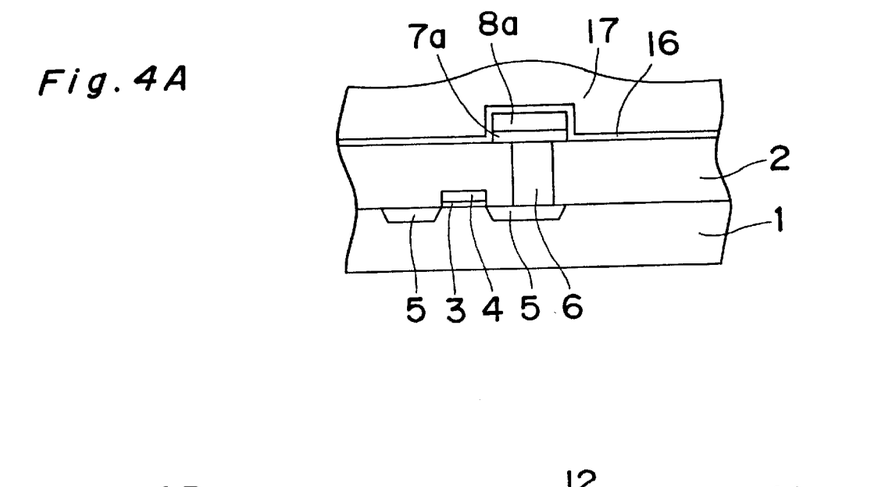
FIGS. 4A, 4B, 4C, 4D, and 4E show process steps for producing a semiconductor storage device according to a second embodiment of the present invention.

Next, the ozone TEOS-NSG film 17 and the SiN film 16 are abraded by CMP until the barrier metal is exposed and the wafer surface is planarized.

Figure 4B:
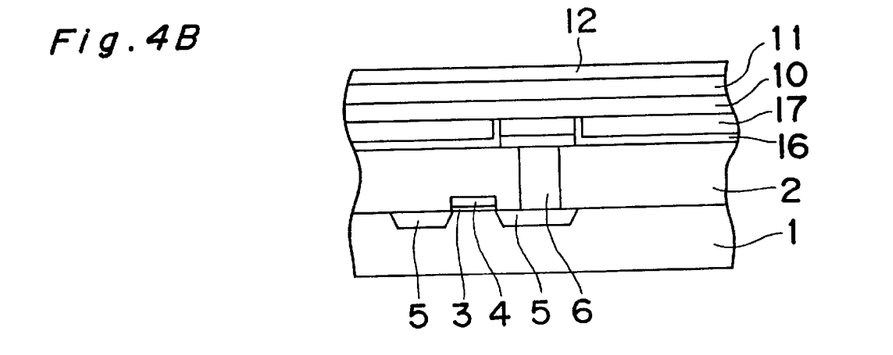
Figure 4C:
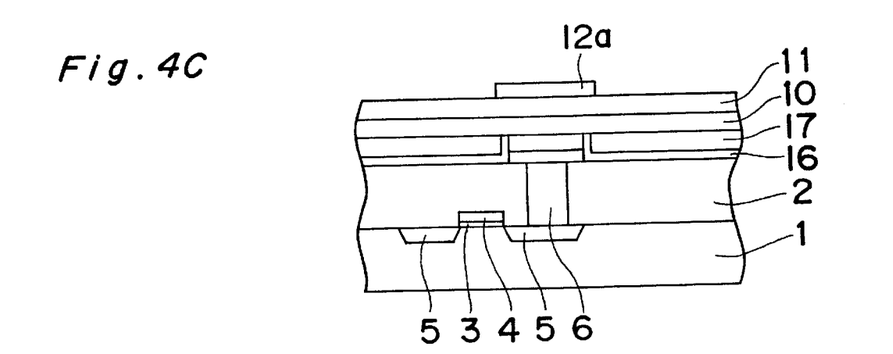
Figure 4D:
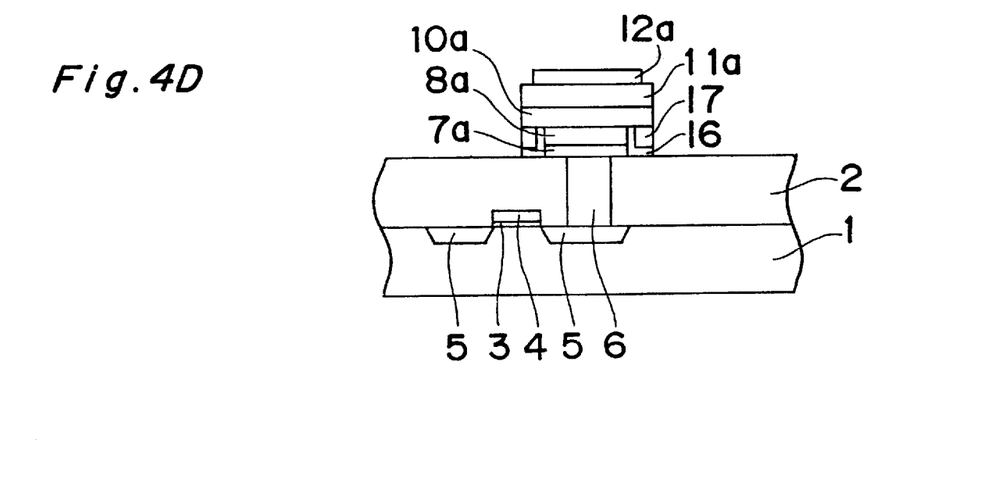

Next, an Ir film 10, which will be a lower electrode, is formed to a thickness of 150 nm by the DC magnetron sputtering method. In the following process, a ferroelectric film 11 is formed. In this embodiment, an SrBi$_2$Ta$_2$O$_9$ (SBT) film 11 is formed in a manner same as the first embodiment. The final thickness of the SBT film 11 is 150 nm. After the SBT film 11 is formed, a platinum (Pt) film 12 is deposited to a film thickness of 100 nm by the DC magnetron sputtering (FIG. 4B). Then, the Pt film 12 is patterned into an upper electrode 12a of a ferroelectric capacitor by a known photolithography and dry etching technique (FIG. 4C), and subsequently the films 11 and 10 are patterned into a SBT ferroelectric 11a and an Ir lower electrode 10a of the ferroelectric capacitor by a known photolithography and dry etching technique (FIG. 4D). Note that after etching the Pt film 12, a heat treatment is performed for 30 minutes as an electrode annealing process at a temperature of 700° C. in an O$_2$ ambient. The size of the Ir lower electrode 10a is larger than the size of the barrier metal 8a. In this embodiment, the Ir lower electrode 10a is 4 μm square. In processing the Ir film 10 into the Ir lower electrode 10a, the ozone TEOS-NSG film 17 and SiN film 16, namely liners, are also etched away so that the first interlayer dielectric 2 is exposed. The resulting SiN film 16 is generally L-shaped in section. In the second embodiment, overetching of the Ir film 10 results in the etching of the TEOS-NSG film 17 and SiN film 16, and not the etching of the barrier metal 8a, similarly to the first embodiment. Accordingly, etch residue occurring when etching the Ir film 10 can be easily removed by a chemical liquid.

Figure 4E:
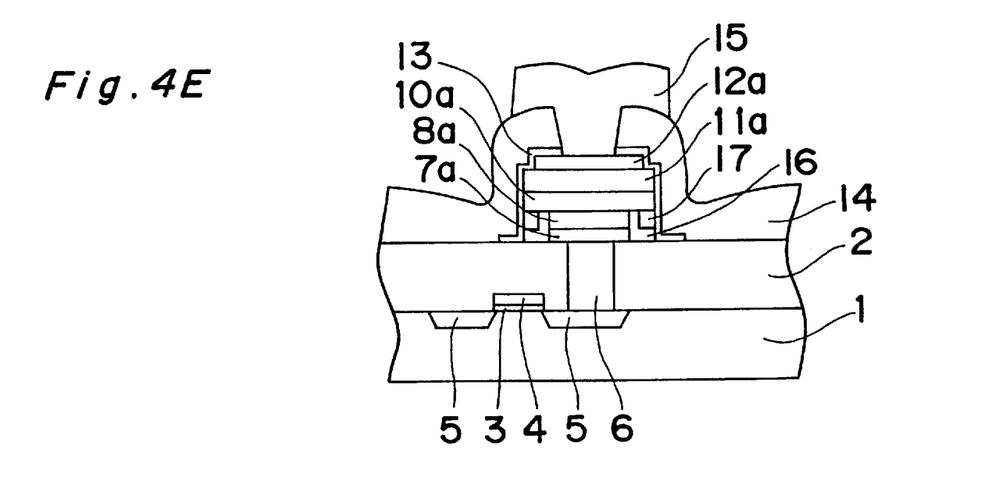

After the above etching process, a titanium oxide (TiO$_2$) film 13 as a diffusion barrier film is deposited to a thickness of 25 μm by sputtering and then the film is processed into a pattern to cover almost the entire ferroelectric capacitor. After that, a second interlayer dielectric 14 is deposited to a thickness of 300 nm. This second interlayer dielectric 14 is an ozone TEOS-NSG film like the first interlayer dielectric. Then, a contact hole leading to the upper electrode 12a of the ferroelectric capacitor is formed in the second interlayer dielectric 14 and TiO$_2$ film 13 by photolithography and dry etching. After that, wiring 15 of an Al-based material is formed (FIG. 4E).

In the second embodiment, similar to the first embodiment, permeation of oxygen is suppressed by the SiN film 16, so that poor conduction and/or film detachment caused from the oxidation of the barrier metal is suppressed.

Figure 5:
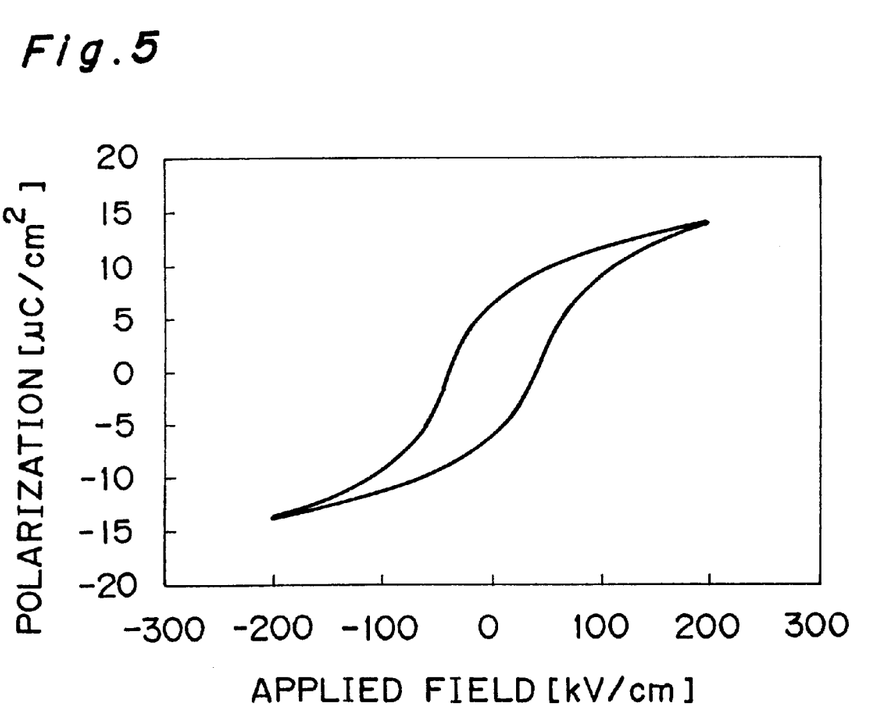
FIG. 5 shows a hysteresis characteristic of a ferroelectric capacitor in the semiconductor storage device of the second embodiment.

FIG. 5 shows the hysteresis characteristic of the ferroelectric capacitor formed through the above steps. The hysteresis curve in FIG. 5 shows good symmetry, which proves that considerably good results were obtained.

Third Embodiment

The following describes process steps of fabricating the semiconductor storage device according to a third embodiment with reference to FIGS. 6A–6I.

Figure 6A:
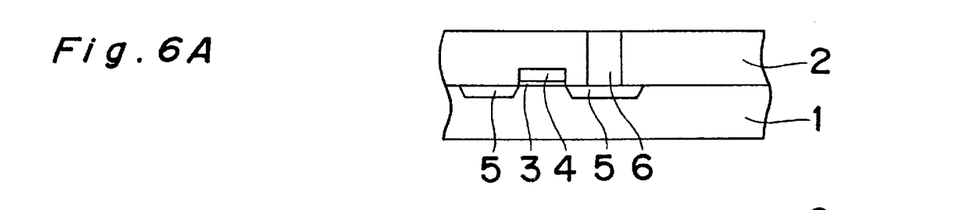
FIGS. 6A, 6B, 6C, 6D, 6E, 6F, 6G, 6H and 6I show process steps for producing a semiconductor storage device according to a third embodiment of the present invention.

First, using a CVD method, a silicon oxide film is formed as a first interlayer dielectric 2 on a silicon substrate 1 formed with a MOS transistor. Then, a contact hole of 0.6 μm in diameter leading to a source/drain region 5 of the MOS transistor is formed in the first interlayer dielectric 2 by lithography and dry etching. Then, by the CVD method, the contact hole is filled with polysilicon, which is then doped with phosphorus (P) for resistance reduction.

Thereafter, the phosphorus-diffused polysilicon and the first interlayer dielectric 2 are planarized by CMP. As a result, the polysilicon plug 6 as a conductive contact plug is completed (FIG. 6A).

Figure 6B:
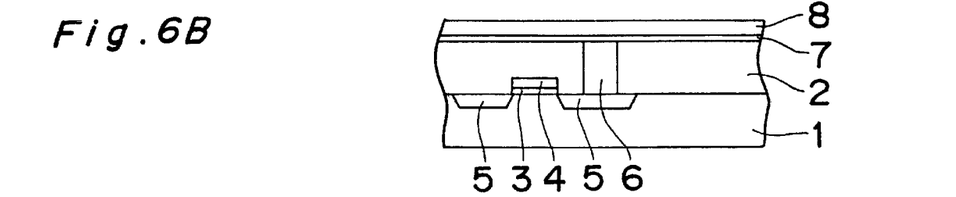

Next, a Ti film 7 serving as an adhesion layer is deposited to a thickness of 20 nm. Then, a TaSiN film 8 is formed to a thickness of 50 nm by reactive sputtering using an alloy of tantalum and silicon as a target (FIG. 6B).

Figure 6C:
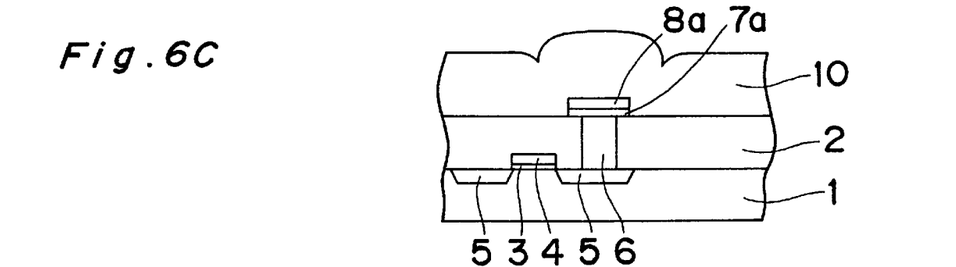

Then, using a known photolithography and dry etching technique, the TaSiN film 8 and the Ti film 7 are continuously patterned into a barrier metal 8a and an adhesion layer 7a, each 1.2 μm square, which are positioned directly on the polysilicon plug 6. Next, an iridium (Ir) film 10, which is a lower electrode material, is formed on the barrier metal 8a and the first interlayer dielectric 2 to a thickness of 300 nm by sputtering (FIG. 6C).

Figure 6D:
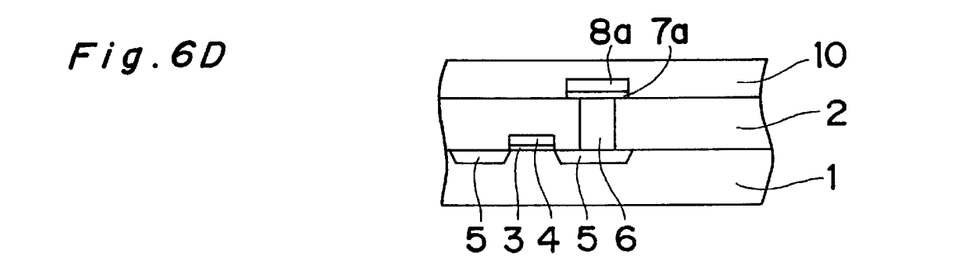

Next, the Ir film 10 is planarized using the CMP technique such that the Ir film of a thickness of 200 nm remains over the barrier metal 8a (FIG. 6D).

Figure 6E:
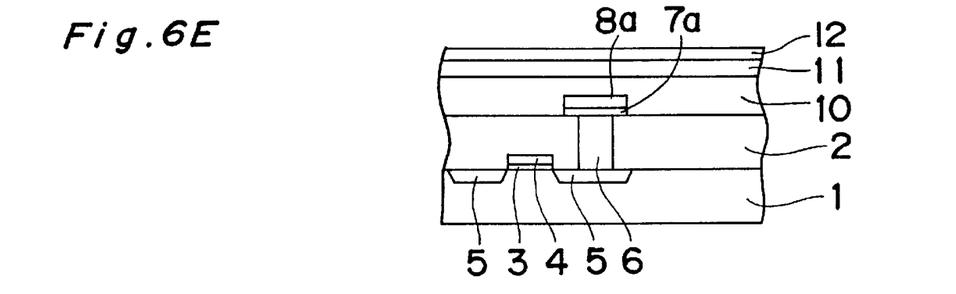

Next, an SBT film 11, namely a ferroelectric material, is deposited to a thickness of 150 nm by spin coating. Subsequently, a platinum (Pt) film 12, namely an upper electrode material, is deposited to a film thickness of 100 nm by sputtering (FIG. 6E).

Figure 6F:
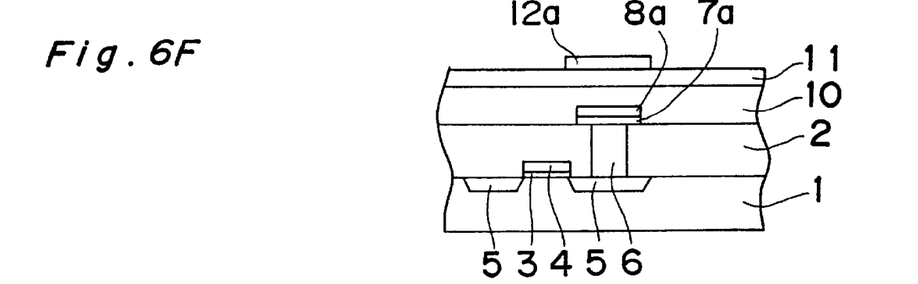

Then, the Pt film 12 is patterned into an upper electrode 12a, 1.2 μm square, of a ferroelectric capacitor by lithography and dry etching (FIG. 6F), and then a heat treatment is performed for 30 minutes as an electrode annealing process at a temperature of 700° C. in an O$_2$ ambient (FIG. 6F).

Figure 6G:
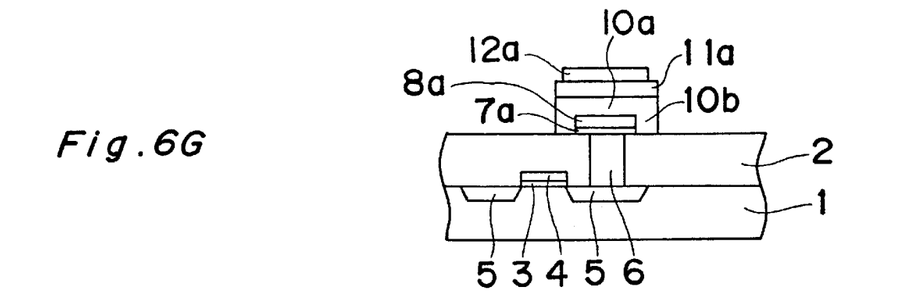

Then, by lithography and dry etching, the SBT film 11 and the Ir film 10 are continuously formed into a ferroelectric 11a and a lower electrode 10a of an inverted-U shape in section such that the lower electrode 10a covers the entire top surface and the entire side surfaces of the barrier metal 8a of TaSiN. A lower portion 10b of the lower electrode 10a which covers the side surfaces of the barrier metal 8a and the adhesion layer 7a serves as an anti-oxygen-permeation film. In this manner, a ferroelectric capacitor including the Pt upper electrode 12a, the capacitor ferroelectric 11a, and the Ir lower electrode 10a is formed on the silicon plug 6, with the TaSiN film 8a disposed between the plug 6 and the lower electrode 10a (FIG. 6G). Note that the size of the lower electrode 10a is required to be large enough to cover at least the top surface of the TaSiN barrier metal 8a, namely, the upper Ir film portion 10a is required to be larger than the size of the barrier metal 8a. In this embodiment, the Ir lower electrode 10a has a size of 4 μm by 4 μm.

According to the conventional method as mentioned above, it is necessary to stop the etching at an interface between the Ir film, which will be a lower electrode, and the TaSiN film, which will be a barrier metal. According to the embodiment, however, if the Ir film 10 is overetched during the process of etching the Ir film, not the TaSiN film 8 but the first interlayer dielectric (silicon oxide film) 2 is etched. Accordingly, etching residue occurring in the etching process of the Ir film 10 can be easily removed by a chemical liquid.

In this embodiment, the lower electrode 10a covering the entirety of the upper and side surfaces of the TaSiN film (barrier metal) 8a serves both as a lower electrode and as an anti-oxygen-permeation film for preventing the TaSiN film 8a from being oxidized during a ferroelectric-recovery heat treatment process that is performed later.

Figure 6H:
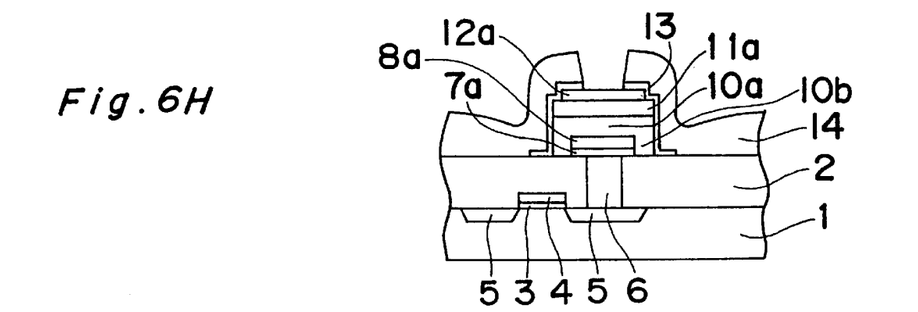

After the above etching process, a titanium oxide (TiO$_2$) film 13 as a diffusion barrier film is deposited to a thickness of 25 nm by reactive sputtering and then the film is processed into a pattern to cover almost the entire ferroelectric capacitor. After that, a second interlayer dielectric 14 of silicon oxide is deposited to a thickness of 300 nm by the CVD technique. Then, a contact hole 0.7 µm diameter leading to the Pt upper electrode 12a of the ferroelectric capacitor is formed in the second interlayer dielectric 14 and $TiO_2$ film 13 by lithography and dry etching (FIG. 6H).

Next, a heat treatment is performed to recover the SBT film 11a serving as a capacitor ferroelectric. The heat treatment conditions are: a temperature of 700° C., a time of 30 minutes, and an $O_2$ ambient under a normal pressure. In the case of fabricating a semiconductor storage device with the conventional structure as mentioned above, it is difficult to perform a high temperature heat treatment in the $O_2$ ambient after the ferroelectric capacitor has been formed, for the following reason. That is, the barrier metal is oxidized at its side surfaces by oxygen permeating into the barrier metal through the second interlayer dielectric, resulting in occurrence of the poor conduction and the film detachment. In contrast, with the arrangement of the present invention, the Ir film lower portion, or anti-oxygen-permeation film 10b which is unified with the lower electrode 10a, suppresses the permeation of oxygen into the TaSiN film (namely, barrier metal) 8a, so that the barrier metal 8a is hardly oxidized.

Figure 6I:
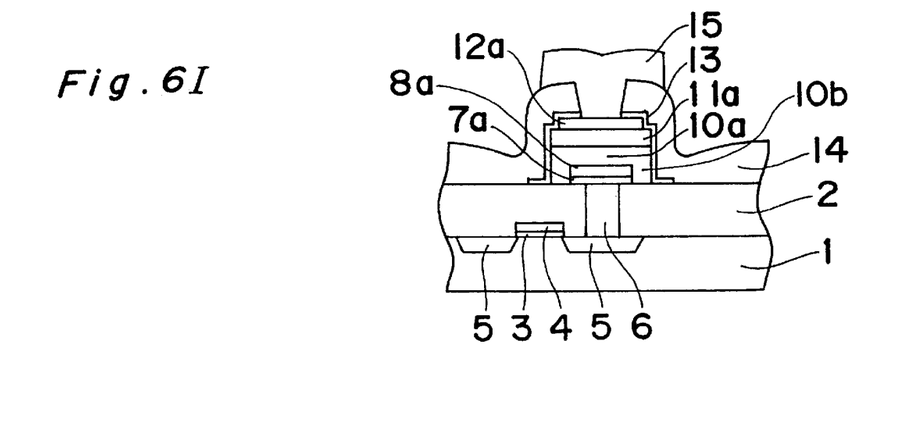

Finally, wiring 15 of an Al-based material is formed (FIG. 6I).

In the first through third embodiments, an SBT film is used as the ferroelectric material. The ferroelectric film is not limited to this material, but may also be formed of a material constituting a ferroelectric stratiform perovskite structure containing Bi or a material constituting a ferroelectric perovskite structure containing Pb, such as, for example, $(Pb_xLa_{1-x})(Zr_YTi_{1-Y})O_3$ ($0 \leq X, Y \leq 1$), $Bi_4Ti_3Q_{12}$, $BaMgF_4$. Also, in the first to third embodiments the barrier metal is formed of TaSiN, although this material is not limitative and it is also possible to use other materials, such as TiN, TiAlN, TiSiN, WSiN, that can prevent a reaction between the conductive contact plug material and the lower electrode material from occurring. Furthermore, although the first interlayer dielectric is formed of a silicon oxide in the first to third embodiments, alternatively it may be formed of a silicon nitride film or a multi-layered film of a silicon oxide film and a silicon nitride film.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising a MOS transistor formed on a semiconductor substrate, and a capacitor having a lower electrode, an upper electrode, and a dielectric between the lower and upper electrodes, said lower electrode of the capacitor being electrically connected with a source/drain region of the MOS transistor through a contact plug and a barrier metal provided on or above the contact plug, said barrier metal having upper, lower and side surfaces, comprising:

an adhesion layer having upper, lower and side surfaces and being disposed between the contact plug and the barrier metal, the adhesion layer only covering the lower surface of the barrier metal:

an anti-oxygen-permeation film being formed only on the side surfaces of the barrier metal and the adhesion layer; and the lower electrode only covering the upper surfaces of the barrier metal and anti-oxygen-permeation film.

2. The semiconductor storage device according to claim 1, wherein the anti-oxygen-permeation film is formed of SiN or SiON.

3. The semiconductor storage device according to claim 1, wherein the dielectric is a ferroelectric.

4. The semiconductor storage device according to claim 1, wherein the lower electrode is formed of Ir.

5. The semiconductor storage device according to claim 1, further comprising an adhesion layer between the contact plug and the barrier metal, wherein the anti-oxygen-permeation film is also formed on side surfaces of the adhesion layer.

6. The semiconductor storage device according to claim 1, further comprising a diffusion barrier film covering the capacitor.

7. The semiconductor storage device according to claim 1, wherein the anti-oxygen-permeation film has a thickness of 0.1 µm or more in a horizontal direction of the semiconductor substrate.

8. A semiconductor storage device comprising a MOS transistor formed on a semiconductor substrate, and a capacitor having a lower electrode, an upper electrode, and a dielectric between the lower and upper electrodes, said lower electrode of the capacitor being electrically connected with a source/drain region of the MOS transistor through a contact plug and a barrier metal provided on or above the contact plug, said barrier metal having upper, lower and side surfaces, comprising:

an adhesion layer having upper, lower and side surfaces and being disposed between the contact plug and the barrier metal, the adhesion layer only covering the lower surface of the barrier metal:

an anti-oxygen-permeation film being formed only on the side surfaces of the barrier metal and the adhesion layer; and the lower electrode covering at least the upper surfaces of the barrier metal and anti-oxygen-permeation film;

wherein the anti-oxygen-permeation film is generally L-shaped in section and an insulating film is formed on side surfaces of the anti-oxygen-permeation film, and wherein the insulating film has a film stress smaller than a film stress of the anti-oxygen-permeation film or has a film stress acting in a direction opposite to a direction in which the film stress of the anti-oxygen-permeation film acts.

9. The semiconductor storage device according to claim 8, wherein the lower electrode is formed over the barrier metal, the anti-oxygen-permeation film, and the insulating film.

10. The semiconductor storage device according to claim 8, wherein the anti-oxygen-permeation film has a thickness of 0.03 µm or more in a horizontal direction of the semiconductor substrate.

11. The semiconductor storage device according to claim 1, wherein the anti-oxygen-permeation film is formed of a material same as a material of the lower electrode so that the anti-oxygen-permeation film and the lower electrode are unified.

12. The semiconductor storage device according to claim 1, wherein the contact plug is a polysilicon plug.

* * * * *